United States Patent [19]
Reible

[11] 3,979,602
[45] Sept. 7, 1976

[54] RESISTIVE NEURISTOR JUNCTIONS
[75] Inventor: Stanley A. Reible, Madison, Wis.
[73] Assignee: Wisconsin Alumni Research Foundation, Madison, Wis.
[22] Filed: Sept. 30, 1974
[21] Appl. No.: 510,646

[52] U.S. Cl. ............................ 307/201; 307/212; 307/245; 307/277; 307/306
[51] Int. Cl.² ...................................... H03K 19/08
[58] Field of Search .......... 307/201, 212, 245, 277, 307/306

[56] References Cited
UNITED STATES PATENTS

| | | | |
|---|---|---|---|
| 3,238,504 | 3/1966 | Crane | 307/201 |
| 3,355,717 | 11/1967 | Cote | 307/201 |
| 3,599,009 | 8/1971 | Parmentier et al. | 307/201 |

Primary Examiner—Stanley D. Miller, Jr.
Attorney, Agent, or Firm—McDougall, Hersh & Scott

[57] ABSTRACT

A neuristor R-junction is provided by coupling neuristor lines by paths of varying resistance so that a pulse being propagated on one line when coupled to a portion of the second line through a relatively high resistive path will place the second line in the refractory mode thus preventing the propagation of a pulse through that portion of second line; however the same pulse coupled to another portion of the second line through a lower resistance path will cause a pulse to be produced in the second line and propagated in that portion of second line which is not in the refractory mode. Various logic and storage circuits are included in the disclosure.

11 Claims, 10 Drawing Figures

RESISTIVE NEURISTOR JUNCTIONS

BACKGROUND OF THE INVENTION

The invention described herein was made in the performance of work under NASA Contract Number NGR-50-002-160 and is subject to the provisions of Section 305 of the National Aeronautics and Space Act of 1958 (72 Stat. 435; 42 U.S.C. 2457).

This invention relates generally to circuit applications of neuristor devices. More specifically, it relates to a neuristor R-junction and circuits incorporating such a device.

H. D. Crane originally proposed the neuristor in his paper "Neuristor — A Novel Device and System Concept," Proc IRE, Vol. 50, pp. 2048–2060, Oct. 1962. Subsequently H. T. Yuan and A. C. Scott reported in Solid State Electronics, Pergamon Press (Gr. Brit.), Vol. 9, pp. 1149–1150, 1966, the fabrication and testing of a superconductive neuristor. In 1969 R. O. Parmentier in Solid State Electronics, Pergamon Press (Gr. Brit.), Vol. 12, pp. 287–297, reported further development of such a device and noted on page 296 as follows:

"This is not to say that all of the problems in the design of a neuristor logic system have now been solved; quite the contrary is true. For example, if the system design is to follow the spcifications of Crane, it will be necessary to demonstrate the existence of certain specific pulse propagation properties, such as refractoriness, and to prescribe a means for realizing the T- and R-junctions."

In August 1973 it was reported in the Proceedings Of The IEEE, pp. 1141 and 1142 by K. Karawada and T. Suzuki that they had achieved neuristor-line operation with a plasma-coupled semiconductor device including the existence of a refractory period pulse annihilation by the collision of two pulses in a line.

Thus since the publication of the Crane article the art has succeeded in developing neuristor devices. If such devices are to achieve utility in practical circuits, means for coupling one line to another is, as recognized by Parmentier, a necessity.

It is an object of this invention therefore to provide a novel way of realizing R-junctions in neuristor devices.

It is a further object of this invention to provide a novel neuristor device which can be assembled into a variety of circuits.

A still further object of this invention is to provide circuits for the logical handling and/or storage of electrical signals.

BRIEF SUMMARY OF THE INVENTION

The foregoing and other objects of the invention are achieved in one embodiment by the provision of a plurality of conductive paths of varying resistance coupling one neuristor line to another. In other embodiments of the invention, lines so coupled are combined to provide other circuits such as logic, signal storage and adder circuits.

BRIEF DESCRIPTION OF THE DRAWINGS

The invention itself is set forth in claims appended hereto and forming a part of this specification, while an understanding of various embodiments and aspects thereof can be had by reference to the detailed description taken in conjunction with the drawings in which:

DETAILED DESCRIPTION

For a more complete exposition of the neuristor reference is made to the Crane publication referred to above. However, in order to provide an understanding of the nature of this invention it may be stated that an analogy between the neuristor and a nerve axon has been drawn. In the nerve axon and energy discharge at one end propagates toward the other end without attenuation and at a constant velocity so that a signal is thereby transmitted. It is a further characteristic of the axon that as the signal is propagated the axon loses it ability for a period of time to propagate a succeeding signal. This period of time has been designated as the refractory time. Thus a neuristor or a nerve axon in the refractory mode is incapable of propagating a signal.

It has been found — experimentally with respect to superconductive neuristor devices and theoretically with respect to the plasma-coupled semiconductor devices discussed in Karawada and Suzuki publication — that a signal or pulse of less amplitude than that required to achieve propagation from one point to another on a neuristor line can nevertheless be sufficient to place the portion of the line to which the signal is coupled in a refractory mode, thereby rendering that portion incapable, for a period of time, of propagating any further pulses. Thus by providing a resistive pattern coupling between two lines it becomes possible to couple a pulse from one line to the other, whereby that pulse will propagate along one portion of the line but at the same time that same pulse can be used to inhibit propagation of the pulse along a second portion of the line.

Figure 1:
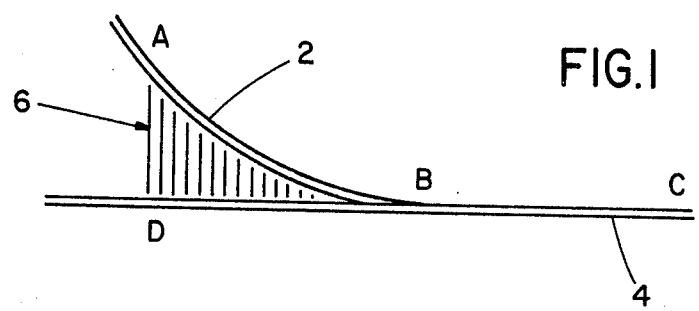
FIG. 1 is a diagrammatic illustration of an embodiment of the invention.

Turning now to FIG. 1 of the drawing, a first embodiment of the ivention may be seen. In this embodiment a first neuristor line 2 is coupled to a second neuristor line 4. The lines themselves may be the superconductive lines described in substantial detail in the Parmentier article cited above. The coupling between lines 2 and 4 is provided by an amount of normal metal 6 or other resistive material connecting one line to another in effect by a plurality of paths of varying resistance — the resistance decreasing from left to right as shown in the drawing.

As an aid to understanding the operation of the invention, the point A has been indicated on line 2. Point B is a junction between line 4 and line 2 wherein there is zero or substantially zero resistance. Point D on line 4 indicates the point at which the maximum resistance path is provided between lines 2 and 4 while point C designates the output end of line 4.

In the operation of this embodiment of the invention, if a pulse is introduced on line 2 and is of sufficient amplitude so as to propagate from point A to point B it will cause an active pulse to be propagated from point B to point C on line 4. At the same time, because the pulse has been coupled to the portion of the line 4 from the points D and B through the paths provided by the normal metal 6, some portion of line 4 between points D and B will be placed in the refractory mode so that no pulse can be propagated on that portion. For the same reason, if a pulse were introduced on line 4 at point D that pulse would be unable to introduce an active pulse on line 2 from points B to A.

As will become more apparent hereinafter in connection with the explanation of various embodiments of the invention, the provision of a junction between two neuristor lines and wherein the coupling is a resistive pattern extending over a portion of both lines, and varies at the point where they are first coupled from a weak coupling to a stronger coupling, results in the achievement of the R-T-junction described by Crane.

Figure 2:
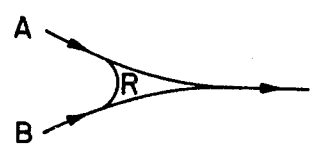
FIG. 2 is an illustration of a suggested symbol for an R-junction in accordance with the invention.
Figure 3:
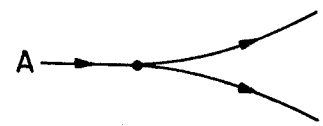
FIG. 3 is an illustration of a suggested symbol for T-junction for a neuristor line for use in circuits in conjunction with the neuristor lines coupled in accordance with the invention.

For ease of explanation of the circuits that follow, the symbols shown in FIGS. 2 and 3 will be used, the symbol of FIG. 2 representing an R-junction in accordance with the invention while the symbol of FIG. 3 represents a T-junction. The various circuits to be described in detail hereinafter will make use of these symbols.

However, before proceeding to give a description of specific circuits representing various aspects and embodiments of this invention, reference is made to FIGS. 4(a), 4(b) and 4(c) which illustrate threshold logic circuits which may be combined in the various circuits described hereinafter with the disclosed R-junction and T-junctions.

Figure 4A:
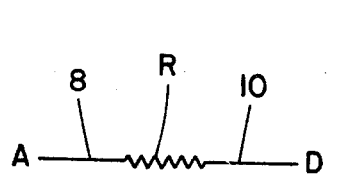
FIGS. 4(a), 4(b) and 4(c) illustrate schematically the different ways in which neuristor lines may be coupled to constitute threshold logic circuits useful in conjunction with the invention.

In FIG. 4(a) input line 8 is coupled to an output line 10 by resistance R. If the resistance R is small enough an active pulse on line 8 will always trigger a pulse on line 10.

Figure 4B:
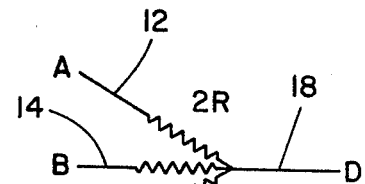

FIG. 4(b) illustrates how this resistive coupling principle can be used to construct a threshold logic circuit. The input lines 12, 14 and 16 are each coupled through a resistor having the value 2R to an output line 18. In this arrangement the value of 2R may be selected so that an input pulse on any two of the lines 12, 14 and 16 is required to trigger a pulse on the output line 18.

Figure 4C:
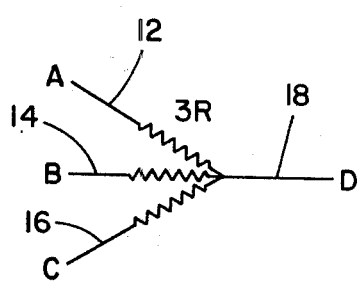

In FIG. 4(c) the value of the coupling resistors has been increased to 3R so that an active pulse is required on all three input lines in order to trigger a pulse on output line 18. Thus it may be seen, if the letter designations used in FIG. 4(a) are referred to, that FIG. 4(b) is a logic circuit providing an output under the following circumstances: $A \cdot B + B \cdot C + C \cdot A$. In FIG. 4(c) an output will be produced under the following circumstances: $A \cdot B \cdot C$.

A further aid to an understanding of the circuits described hereinafter is an appreciation of the significance of signal propagation velocity in a given neuristor line. Depending, of course, on the nature of the line there is a definite propagation velocity. Therefore, when lines are connected to each other in given circuit arrangement and the phenomena of annihilation by collision or refractoriness are relied upon for circuit operation, the length of a line or a section of line under consideration is important. In the drawings illustrating the circuit described below it is intended therefore to approximately represent the relative lengths of the various lines that go to make up the particular circuit described.

Figure 5:
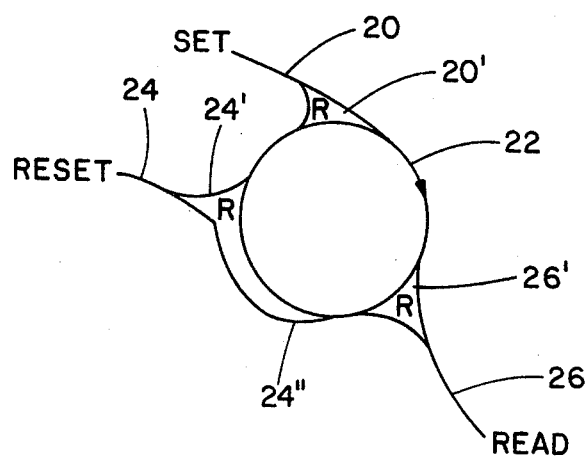
FIG. 5 illustrates schematically how neuristor junctions in accordance with the invention may be used in conjunction with neuristor lines to provide a storage ring.

With the foregoing understandings various embodiments of the circuit aspect of the invention are described. Thus FIG. 5 illustrates a storage ring constituting an embodiment of the invention and consisting of a neuristor line 20 coupled to a neuristor line 22 connected to itself to form a loop and to which are also connected further neuristor lines 24 and 26. The connecting junctions are the R-junctions shown in FIGS. 1 and 2. It should be appreciated that the shape of the ring constituted by the line 22 is not important. It is shown as circular; however, it could be in the form of a rectangle or any other shape in order to conserve physical space in an array of such rings. If the line 20 is designated the set input, the line 24 the reset input and the line 26 the read output, the operation of the ring is as follows.

In use a circulating pulse might indicate a logic 1 while no such pulse indicates a logic 0. If an active pulse is supplied via the line 20 and its associated R-junction 20' it will cause a pulse to be produced in the ring 22 which will circulate clockwise and continue to circulate until it is destroyed by collision with another pulse or by a momentary interruption in a bias supply to the ring itself. Each time the pulse being propagated in the ring 22 passes the R-junction 26' of the readout line 26 a pulse is produced on that line, thereby permitting an indication of the contents of the ring. The ring may be reset to 0 by causing a clear or reset pulse to be supplied to the line 24 and be coupled through its R-junction 24' to the line 22. The R-junction 24' is physically arranged to cause the pulse on the reset line to propagate in the line 22 in a direction opposite (counterclockwise) to that traveled by the pulse supplied from the set line 20. Thus at a certain point it will collide with the set pulse and the two pulses will destroy each other so that no pulse is circulating in the ring 20 and a logic 0 is stored. It should be noted that the minimum resistance portion 24'' of R-junction 24 can be located near the maximum resistance portion of junction 26' so as soon as the reset pulse enters the R-junction 26' the portion of the output line 26 in contact with R-junction will be placed in the refractory mode and any set pulse traveling clockwise and about to enter the junction 26' will not be propagated on readout as line 26 will have been put in the refractory mode because the reset pulse entered the junction 26' first. In this manner the reset time of the ring can be reduced. Generally speaking, this figure serves as an illustration of how an R-junction in accordance with the invention can have a resistance pattern of varying length of contact with a given neuristor line controlling time, synchronization and other parameters of a given circuit.

Figure 6:
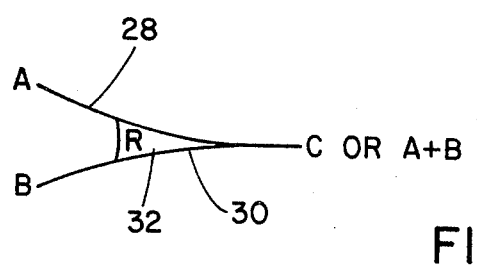
FIG. 6 illustrates schematically a neuristor junction in accordance with the invention used to provide a logic OR circuit.

Thus FIG. 6 illustrates a 2-input or circuit consisting of line 28 coupled to a line 30 through an R-junction 32 as described. In this circuit the inputs are A and B while the output is C. If an active pulse is supplied as an input at the input A of line 28 an output pulse will only appear at C. The R-junction prevents the pulse excited at C from propagating backward to input B. In addition the pulse on line 28 will have placed line 28 and portions of line 30 in a brief refractory mode. Any pulse subsequently supplied on the line at the input B during the refractory period will not excite a second pulse at output C. By the same token, an input pulse at B on line 30 will produce an output at C and at the same time place a portion of the line 28 in the vicinity of the R-junction 32 in the refractory mode. Even if pulses arrive simultaneously on inputs A and B, the pulse emitted at output C will have decayed to a single, normal pulse.

More complicated logic circuits can be constructed using R-junctions in accordance with the invention in combination with T-junctions, and the threshold logic circuits of FIGS. 4(c). As described in the literature, a T-junction consists of three lines directly connected together (see FIG. 3). In such a junction a pulse on any one of the lines will always produce a pulse on the other two lines. Thus in FIG. 7 an input line 40 is connected to a T-junction 40′ while another input line 42 is connected to a T-junction 42′. At the junction 40′ a line 44 is connected through a resistor 2R to a line 46 and another line 48 is connected to an R-junction 50. A still further line 52 is connected from the junction 42′ through a resistor 2R to the line 46 while a line 54 constitutes the other input to the R-junction 50. The output of the R-junction 50 is connected to an output neuristor line 53 and via an R-junction 56 to the line 46.

Figure 7:
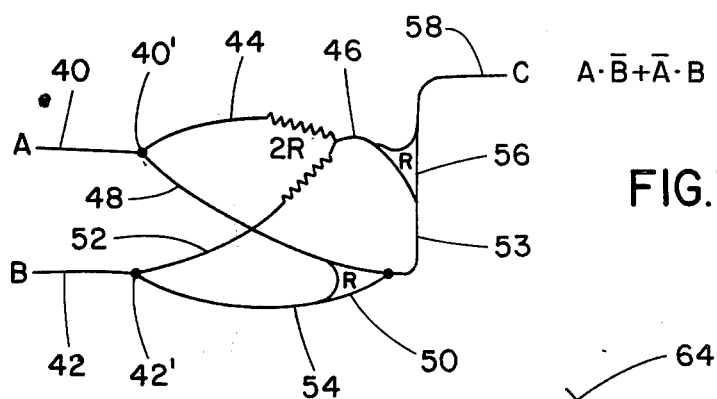
FIG. 7 illustrates schematically how neuristor junctions in accordance with the invention may be combined with neuristor lines and the threshold logic element of FIG. 4(b) to perform still another logical function.

The operation of the circuit of FIG. 7 is as follows. If an input pulse is supplied to A on line 40 the T-junction 40′ will couple that pulse to both of the lines 44 and 48. The pulse propagated via line 44 will, however, not be effective to propagate a pulse in the line 46 because it is coupled thereto by the 2R resistor, and for a pulse to propagate in the clockwise direction on line 46, the pulses must be supplied to both A and B. However, the pulse supplied to A on line 40 will be propagated via line 48 and the R-junction 50 to the line 53. Once propagated in the line 53 it will be further propagated in the line 58 via the R-junction 56 so that an output is produced at C when there is an input at A but no input on B. If there has been simultaneous inputs on the lines 40 and 42 at A and B, an active pulse would have been excited on line 46 and propagated in the clockwise direction. At the same time a pulse would have been excited on line 53 after being propagated through R-junction 50. Line 46 subsequently introduces a pulse on line 53 via R-junction 56. The two pulses moving in opposite directions on line 53 are destroyed by collision resulting in no output at C. Thus there will be an output at C if there is a pulse at A but not pulse at B or as expressed Logically $A \cdot \bar{B}$. We note that proper timing of the propagation delays is important in realization of these logic functions.

A similar explanation pertains if the input pulse conditions were reversed so that the complete logical function of the circuit of FIG. 7 is as follows: $A \cdot \bar{B} + \bar{A} \cdot B$.

Figure 8:
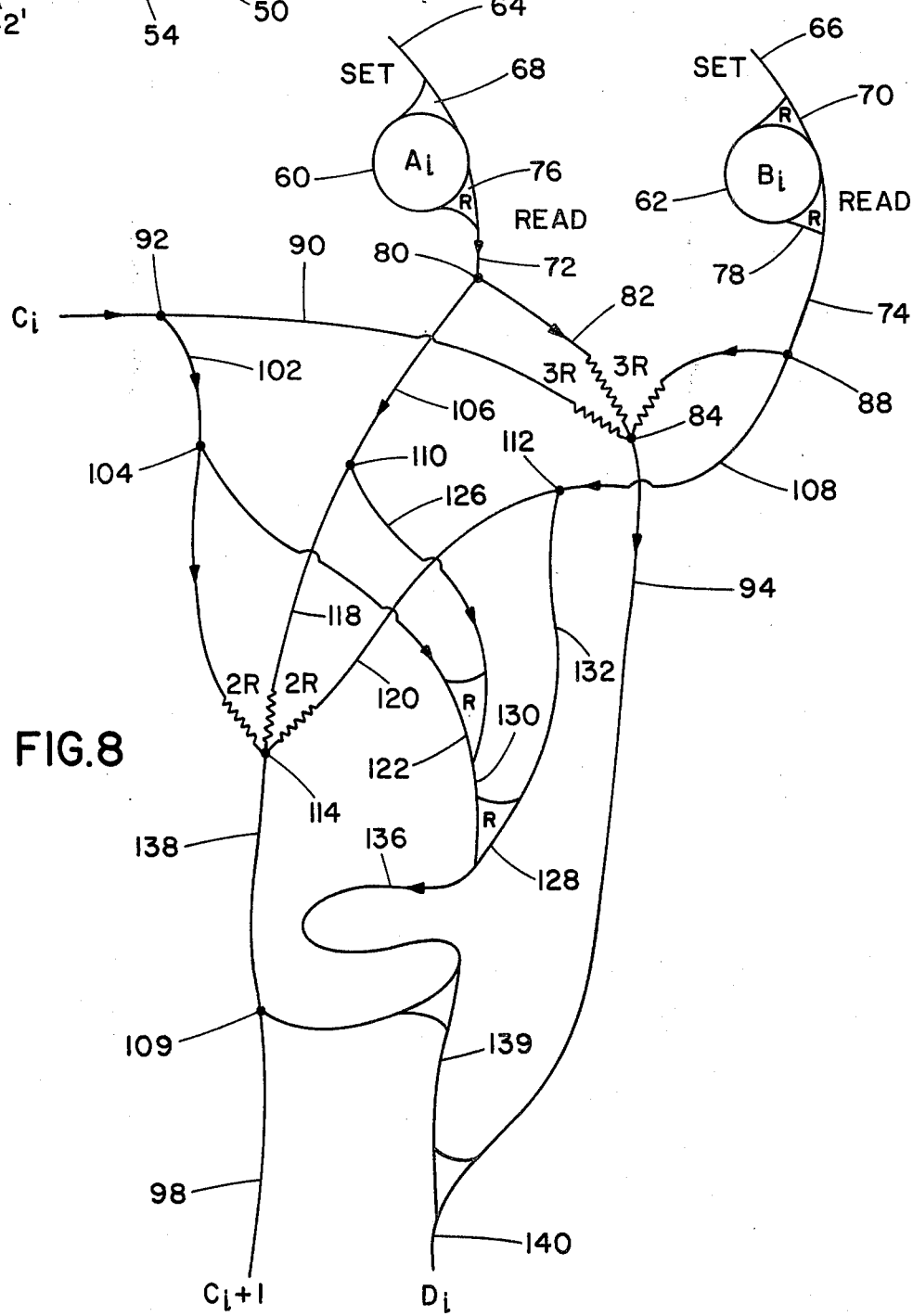
FIG. 8 illustrates how junctions and storage circuits in accordance with the invention may be combined with T-junctions and the illustrated threshold logic circuits to form a binary adder.

A binary adder may be constructed as shown in FIG. 8. The adder illustrated is constituted by a pair of storage rings 60 and 62 having set inputs 64 and 66 through R-junctions 68 and 70, respectively, and read output lines 72 and 74 through R-junctions 76 and 78, respectively. Line 72 is connected to a T-junction 80, one output of which is a line 82 to one input of a three input threshold logic junction 84. Another input to the junction 84 is a line 86 from the T-junction 88 to which the output line 74 of the storage ring 62 is connected. The third input of the junction 84 is a line 90 being one output of a T-junction 92, the input of which is C. The output of the junction 84 is line 94.

In addition to the output line 90 the T-junction 92 has a further output 102 to a T-junction 104. Likewise the T-junctions 80 and 88 have output lines 106 and 108, respectively, constituting inputs to the T-junctions 110 and 112, respectively. A 2R threshold logic junction 114 has three inputs, a line 116 from the junction 104, a line 118 from the junction 110 and a line 120 from the junction 112.

The first R-junction 122 has inputs via the lines 124 and 126 from the T-junctions 104 and 110, respectively. A second R-junction 128 has an input via a line 130 from the R-junction 122 and another input via the line 132 from the T-junction 112.

A third R-junction 134 couples a line 136 from the R-junction 128 to a line 138 from the output of the threshold logic junction 114. The line 136 is also coupled to the line 100 by means of a fourth R-junction 140.

If $A_i$ corresponds to the $i$th digit of a binary number A and $B_i$ corresponds to $i$th digit of binary number B, $C_i+1$ is the carry to $i$th + 1 digit. As may be seen a pulse corresponding to logic 1 or $A_i$, $B_i$ or $C_i$ will always produce on line 136. For instance, a pulse at $C_i$ is propagated via T-junction 92, line 102, T-junction 104, R-junction 122, line 130 and R-junction 128 to that line. Propagation paths to line 136 for $A_i$ and $B_i$ can be similarly traced starting with lines 72 and 74, respectively. If any two or all three of the logic inputs $A_i$, $B_i$ or $C_i$ are excited a pulse will be propagated on line 136 via the 2R logic gate 114. If a pulse is present only on line 136 an output will appear on line 140 ($D_i$) via R-junction 134, line 139 and R-junction 140. However, if pulses appear on both lines 136 and 138 the pulse on line 138 is coupled to line 136 via R-junction 134 and they are both destroyed so that no pulse is transmitted to line 139.

It is noted once again that the various lines are of such lengths as are necessary to provide for the propagation times desired for whatever synchronization is necessary to permit to arrive at certain points to mutually destroy pulses traveling in the opposite direction or to place a line in a refractory mode.

Another path to line 140 or output $D_i$ is provided via line 94 and the 3R logic gate 84 so that the simulataneous presence of $A_i$, $B_i$ and $C_i$ results in an output at $D_i$. Therefore in its totality the circuits perform logical functions according to the following logic or truth table.

| Input | | | Output | |
| --- | --- | --- | --- | --- |
| $A_i$ | $B_i$ | $C_i$ | $D_i$ | $C_i+1$ |
| 0 | 0 | 0 | 0 | 0 |
| 1 | 0 | 0 | 1 | 0 |
| 0 | 1 | 0 | 1 | 0 |
| 0 | 0 | 1 | 1 | 0 |
| 1 | 1 | 0 | 0 | 1 |
| 1 | 0 | 1 | 0 | 1 |
| 0 | 1 | 1 | 0 | 1 |
| 1 | 1 | 1 | 1 | 1 |

Thus there is a carry, $C_i +1$, whenever two or more input pulses are present.

It is intended herein to disclose embodiments of the novel R-junction and to also disclose other aspects of the invention, namely, various embodiments of logic, storage and arithmetical which can be constructed in accordance with the invention by utilizing the R-junction in combination with lines, junctions and logic gates of the prior art. It is intended by the claims appended hereto and forming a part of this specification to cover all variations and embodiments as come truly within their scope.

What is claimed as new and desired to secure by Letters Patent is:

1. A junction for coupling one neuristor line to another comprising a relatively high resistance path for coupling one neuristor line to another at a point of first juncture and a relatively low resistance path for coupling said one neuristor line to said another at a point of second juncture.

2. The junction of claim 1 including a plurality of resistive paths for coupling one neuristor line to another varying from a first relatively high value of resistance, through various relatively intermediate values of resistance down a relatively low value of resistance.

3. A neuristor junction comprising first and second neuristor lines, means coupling said first line to said second line providing a resistive pattern varying from a relatively high value at a first point of juncture of said first and second lines to a relatively low value at a second point of juncture of said first and second lines.

4. The neuristor junction of claim 3 wherein said means provides a resistive pattern varying through intermediate values between the relatively high value and the relatively low value.

5. A neuristor junction comprising first and second superconductive neuristor lines, means formed from a normal metal coupling said first line to said second line providing a resistive pattern varying from a relatively high value at a first point of juncture of said first and second lines to a relatively low value at a second point of juncture of said first and second lines.

6. The neuristor junction of claim 5 wherein said means provides a resistive pattern varying through intermediate values between said relatively high value and said relatively low value.

7. A signal processing circuit comprising a first neuristor line formed as a closed loop, a second neuristor line, means coupling said second neuristor line to said first neuristor line providing a plurality of paths of varying resistance from one portion of said first line to a portion of said second line.

8. The signal processing circuit of claim 7 wherein the resistance of said paths vary from a relatively high value through a range of intermediate values to a relatively low value.

9. The signal processing circuit of claim 7 including a third neuristor line and a second means coupling said third neuristor line to said first neuristor line providing a plurality of paths of varying resistance from another portion of said first line to a portion of said third line.

10. The signal processing circuit of claim 8 including a threshold logic neuristor gate connected to said first neuristor line.

11. The signal processing circuit of claim 8 including a neuristor T-junction connected to said second neuristor line.

* * * * *